(12) United States Patent
Bilhan

(10) Patent No.: US 7,375,664 B2
(45) Date of Patent: May 20, 2008

(54) SYSTEMS AND METHODS FOR PROVIDING ANTI-ALIASING IN A SAMPLE-AND-HOLD CIRCUIT

(75) Inventor: Haydar Bilhan, University Park, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/448,695

(22) Filed: Jun. 7, 2006

(65) Prior Publication Data
US 2007/0285296 A1    Dec. 13, 2007

(51) Int. Cl.
*H03M 1/00*   (2006.01)
(52) U.S. Cl. .................................. 341/122; 341/155
(58) Field of Classification Search ................ 341/122, 341/155, 141
See application file for complete search history.

(56) References Cited
U.S. PATENT DOCUMENTS

| | | | |
|---|---|---|---|
| 3,571,757 A | * | 3/1971 | Kiyasu et al. ............... 341/143 |
| 4,527,190 A | * | 7/1985 | Onga et al. .................. 348/659 |
| 5,544,064 A | | 8/1996 | Beckwith |
| 6,600,440 B1 | * | 7/2003 | Sakurai ....................... 341/172 |
| 6,768,374 B1 | * | 7/2004 | Lee ................................. 330/9 |
| 6,937,174 B2 | * | 8/2005 | Higashi et al. ............. 341/122 |
| 7,113,116 B2 | * | 9/2006 | Brewer et al. .............. 341/122 |

\* cited by examiner

*Primary Examiner*—Peguy JeanPierre
(74) *Attorney, Agent, or Firm*—Wade J. Brady, III; Frederick J. Telecky, Jr.

(57) ABSTRACT

Systems and methods are included for providing anti-aliasing in a sample-and-hold circuit. One embodiment of the present invention includes a method for sampling of an input signal for providing to an analog-to-digital converter. The method comprises generating a sample signal having a given frequency and a period that defines both a sample phase and a hold phase. The method also comprises sampling the input signal at both the sample phase and the hold phase. The method further comprises generating a decimated output sample that is an aggregate of consecutive samples of the input signal obtained during the sample phase and the hold phase.

22 Claims, 4 Drawing Sheets

SYSTEMS AND METHODS FOR PROVIDING ANTI-ALIASING IN A SAMPLE-AND-HOLD CIRCUIT

TECHNICAL FIELD

This invention relates to electronic circuits, and more specifically to systems and methods for providing anti-aliasing in a sample-and-hold circuit.

BACKGROUND

With high definition TV (HDTV) broadcasts widely available and with the requirement of supporting standard definition TV (SDTV) as well as PC graphics, cost effective system-on-chip (SOC) HDTV/SDTV/Graphics solutions are very desirable. These SOCs require analog front end integration on the same die with a very large amount of digital circuitry. For example, a typical HDTV/SDTV/PC-graphic processor may integrate 3 ADC channels, multiple asynchronous phase-locked-loops (PLLs) and delay-locked-loops (DLLs), and 6 digital-to-analog converters (DACs) with a digital signal processing section of 8 million digital gates or more in a 90 nm or smaller digital CMOS process. An integrated circuit (IC) package with 544 pins or more may be required to implement such a processor due to such a large number of input/output pins. These packages may have a large inductance on analog power supply connections, thus creating additional internal power-supply noise. Also, with the competitive market in consumer electronics and high wafer costs in smaller geometry processes, any solution that will require large die-area, such as multi-stage active analog filters, is not very desirable. In addition, since analog video signals can be single-ended, meeting the noise requirements for an analog-to-digital converter (ADC) can be much more difficult.

A typical interface for an analog signal to an ADC is a sample-and-hold circuit. FIG. 1 demonstrates a typical sample-and-hold circuit 10. The sample-and-hold circuit 10 obtains samples of an input signal $V_{IN}$ at a given sampling rate, and provides discrete time output samples of the input signal $V_{IN}$ to a given ADC. The input signal $V_{IN}$ could be a differential signal. The sample-and-hold circuit 10 includes a sample stage 12 and a hold stage 14. The sample stage 12 could operate to obtain the samples of the differential signal $V_{IN}$ at a given sampling rate. The hold stage 14 could operate to transfer the obtained samples to an output of the sample-and-hold circuit 10 as discrete time output samples $V_{OUT}$ at output terminals 18.

The sample stage 12 includes a pair of switches controlled by a clock signal P1 (hereinafter "P1 clock switch(es)"), a pair of switches controlled by a clock signal P2 (hereinafter "P2 clock switch(es)"), a pair of switches controlled by a clock signal $P_S$ (hereinafter "$P_S$ clock switch(es)"), a capacitor C1, and a capacitor C2. The differential signal $V_{IN}$ is demonstrated in the example of FIG. 1 as a positive rail input signal $V_{IN}+$, a negative rail input signal $V_{IN}-$, and a common mode voltage signal CM that is associated with the input signal $V_{IN}$. The common mode signal CM can have a voltage potential that is substantially centered (i.e., mean) between the signal $V_{IN}+$ and the signal $V_{IN}-$. It is to be understood that, because the input signal $V_{IN}$ is a differential signal, the negative rail input signal $V_{IN}-$ is a complement of the positive rail input signal $V_{IN}+$. Thus, the negative rail input signal $V_{IN}-$ may not be negative relative to zero, but could be negative relative to the common mode signal CM. In addition, the common mode signal CM could have a floating voltage potential, as well. The sample stage 12 also receives another common mode signal CM2, which could be a fixed voltage potential. It is to be understood that the common mode signal CM and the common mode signal CM2 could be the same voltage potential. The hold stage 14 includes a pair of P2 clock switches, a capacitor C3, a capacitor C4, and an inverting amplifier 16. The inverting amplifier 16 has a positive input terminal that is coupled to both the capacitors C1 and C3 and a negative input terminal that is coupled to both the capacitors C2 and C4. The common mode signal CM2 can be a voltage potential that is sufficient to bias the inverting amplifier 16. The inverting amplifier 16 also has output terminals that are coupled to the output terminals 18 of the sample-and-hold circuit 10, which outputs the discrete time output samples $V_{OUT}$ of the input signal $V_{IN}$.

The $P_S$ clock signal defines a sample signal (not shown) that defines a sampling rate associated with the sample-and-hold circuit 10. The sample signal can have a period that defines both a sample phase and a hold phase. An example of the operation of the sample signal in relation to the P1, P2 and $P_S$ clock switches is demonstrated in the example of FIG. 2. FIG. 2 illustrates an example of a timing diagram 50 associated with the sample-and-hold circuit 10 in the example of FIG. 1. The timing diagram 50 is demonstrated in the example of FIG. 2 as being an ideal timing diagram. However, it is to be understood that, in actuality, there are delays associated with the timing diagram 50. For example, the example of FIG. 2 demonstrates that the P1 clock switches and the $P_S$ clock switches activate and deactivate at substantially the same time. However, it is to be understood that the $P_S$ clock switches may actually deactivate before the P1 clock switches to avoid signal dependent charge injection.

In the example of FIG. 2, the sample signal can define the sample phase when the sample signal is asserted (i.e., P1 and $P_S$ being logic high) and the hold phase when the sample signal is de-asserted (i.e., P2 being logic low). Accordingly, the P1 and $P_S$ clock switches can close during the sample phase, and the P2 clock switches can close during the hold phase. It is to be understood that, throughout the discussion herein of FIG. 2, reference will be made to FIG. 1, such that like identifiers and reference numbers will be used.

During the sample phase, due to the closure of the P1 and $P_S$ clock switches, the capacitor C1 is coupled to the signal $V_{IN}+$ and the common mode signal CM2, and the capacitor C2 is coupled to the signal $V_{IN}-$ and the common mode signal CM2. Therefore, the capacitors C1 and C2 each become charged with a voltage potential of $V_{IN}+$ and $V_{IN}-$, respectively, during the sample phase. The timing diagram 50 demonstrates a sample of the input signal $V_{IN}$ being captured at the end (i.e., falling edge) of two separate sample phases, demonstrated in the example of FIG. 2 at the dashed lines 52.

The captured sample of the input signal $V_{IN}$ then gets transferred to the hold stage during each of the subsequent hold phases. For example, during the hold phase, the P1 and $P_S$ clock switches open and the P2 clock switches close. The capacitors C1 and C2 become coupled to the common mode voltage CM and the capacitors C3 and C4, respectively. The capacitors C3 and C4 also become coupled to the output terminals 18. The capacitors C1 and C2 therefore discharge the captured sample of the input signal $V_{IN}$ to the capacitors C3 and C4, respectively. During the transition from the sample phase to the hold phase, the capacitors C1, C2, C3, and C4 conserve the total amount of charge between them. Thus, because the capacitors C3 and C4 are also coupled to the common mode signal CM at the input of the inverting amplifier 16 during the hold phase, the input signal $V_{IN}$ at the respective capacitors C3 and C4 experiences a gain that is approximately equal to the ratio of capacitance of the sampling capacitors C1 and C2 to the feedback (i.e., hold) capacitors, and is output at the output terminals 18 as a discrete time output sample $V_{OUT}$. It is to be understood that, in order to decrease the voltage gain of the sample-and-hold circuit 10, the capacitance value of the capacitors C3 and C4 can be increased linearly or the capacitance value of the capacitors C1 and C2 can be decreased linearly. It is also to be understood that a typical sample-and-hold circuit may set the capacitance of C1 equal to C2, and the capacitance C3 equal to C4.

It is to be understood that the sample-and-hold circuit 10 is not intended to be limited to the example of FIG. 1. For example, the sample-and-hold circuit 10 could have additional common mode voltages associated with the P1, P2 and $P_S$ clock switches. Furthermore, the P2 clock switches could merely couple the capacitors C1 and C2 together during the hold phase, instead of coupling each to the common mode signal CM. As another example, another set of P1 clock switches could couple the capacitors C3 and C4 to yet another common mode signal, such that the discrete time output samples $V_{OUT}$ could reflect a level-shifted voltage potential. In addition, the sample-and-hold circuit 10 can also perform single-ended input to differential output conversion, programmable gain, and offset correction functionalities preceding an analog-to-digital converter. Accordingly, the sample-and-hold circuit 10 could be modified in a variety of ways as known in the art.

A potential problem for a typical sample-and-hold architecture is aliasing. For example, noise components having a frequency that is approximately equal to the frequency of a sample signal, or an integer multiple of the frequency of the sample signal, can result in aliasing of the noise components to the baseband signal around approximately 0 Hz at the sampled output. A common solution to the problem of aliasing is filtering the input signal prior to sampling it. For example, a passive RC or LC filter can be implemented to filter the input signal prior to the given sample-and-hold circuit. Simple RC and LC filters are convenient, but often lack efficiency since they attenuate noise efficiently on very high frequencies and hence require the ADC to use a very high sampling frequency. A high order active filter, with multiple-stage amplifiers, can be implemented to filter the input signal prior to the given sample-and-hold circuit with much better attenuation than a passive filter. However, a typical active filter often consumes an undesirably large amount of power. In addition, a typical active filter is larger, thus requiring more die area and making it more difficult to integrate with the sample-and-hold circuit and/or ADC to avoid external noise coupling. They may also degrade the linearity of the signal and introduce phase distortion. Sigmadelta converters are also not very suitable because they cannot handle large analog video input bandwidth requirements.

SUMMARY

One embodiment of the present invention includes a method for sampling of an input signal for providing to an analog-to-digital converter. The method comprises generating a sample signal having a given frequency and a period that defines both a sample phase and a hold phase. The method also comprises sampling the input signal at both the sample phase and the hold phase. The method further comprises generating a decimated output sample that is an aggregate of consecutive samples of the input signal during the sample phase and the hold phase Another embodiment of the present invention includes an anti-aliasing sample-and-hold circuit associated with an analog-to-digital converter (ADC). The sample-and-hold circuit comprises a sample stage comprising a plurality of sample switches and at least one sample capacitor. The plurality of sample switches could be controlled by a sample signal having a given frequency and a period that defines both a sample phase and a hold phase. The sample stage could be operative to sample the input signal at both the sample phase and the hold phase and generate voltage samples of an input signal via the plurality of sample switches at a sampling rate that is approximately twice the given frequency of the sample signal. The sample-and-hold circuit also comprises a hold stage comprising an amplifier. The amplifier could have an input that is coupled to the sample stage and that provides the output of the sample-and-hold circuit. The hold stage could be operative to receive the voltage samples from the sample stage and to output decimated samples at the given frequency of the sample signal. Each of the decimated samples could be associated with two consecutive voltage samples from the sample stage at a given sample phase and a given hold phase.

Another embodiment of the present invention includes an analog-to-digital converter (ADC) system. The system comprises means for providing a sample signal having a given frequency. The system also comprises means for generating a plurality of samples of an input signal at a frequency that is approximately double the given frequency of the sample signal. The decimated output samples have a voltage that is an aggregation of two consecutive sample of the plurality of samples of the input signal. The system also comprises means for converting the decimated output samples to digital output values.

DETAILED DESCRIPTION

The present invention relates to electronic circuits, and more specifically to an anti-aliasing sample-and-hold circuit for an analog-to-digital converter (ADC). A sample-andhold circuit in accordance with an aspect of the invention can receive a sample signal. The sample signal could have a frequency that is greater than or equal to a Nyquist frequency for a given input signal. The sample-and-hold circuit can include a sample stage and a hold stage. The sample stage can operate to sample the input signal at a sampling rate that is twice the frequency of the sample signal.

For example, the sample-and-hold circuit can sample the input signal at both a sampling phase and a hold phase associated with the sample signal. The hold stage can, during the hold phase, provide an output sample that is associated with two consecutive samples obtained by the sample stage. The hold stage can provide an output sample that is associated with both a sample obtained at the sample phase and a sample that is obtained during the same hold phase concurrently with the provided output sample. As another example, the hold stage can provide an output sample that is associated with both a sample obtained at the sample phase and a sample that is obtained during the previous hold phase. The provided output sample could, for example, have a voltage that is an average of the consecutive samples, or it could, as another example, have a voltage that is aggregate sum of the two consecutive samples.

Figure 3:
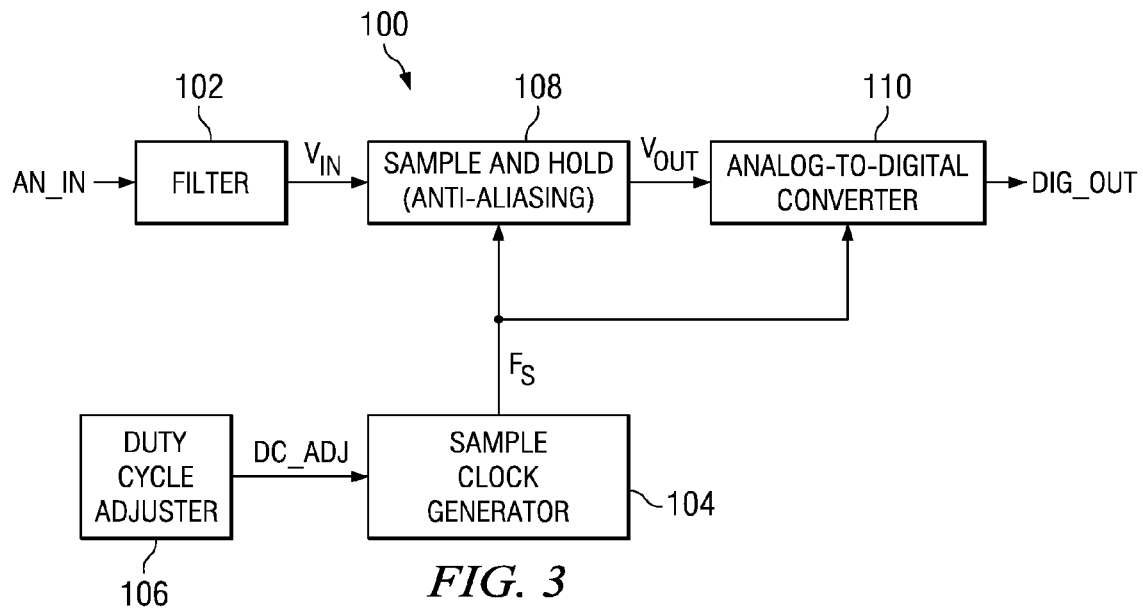
FIG. 3 illustrates an example of an analog-to-digital conversion system in accordance with an aspect of the invention.

FIG. 3 illustrates an example of an analog-to-digital conversion system 100 in accordance with an aspect of the invention. The analog-to-digital conversion system 100 includes a filter 102. The filter 102 receives an analog signal AN_IN, which could be a baseband signal that is output from a video signal source (not shown) or other source device(s). The filter 102 could be a low-pass filter (LPF), such that the filter 102 could remove unwanted higher frequency portions of the analog signal AN_IN. However, it is to be understood that the filter 102 could also include a band-pass filter or other type of filter to remove unwanted noise components in a given frequency range. The filter 102 outputs a signal $V_{IN}$, which could be just a filtered version of the analog signal AN_IN. The signal $V_{IN}$ could be a differential signal, such that the analog signal AN_IN is also a differential signal. Alternatively, the filter 102 could include, for example, one or more components operative to convert a single-ended analog signal AN_IN into a differential signal $V_{IN}$.

The analog-to-digital conversion system 100 also includes a sample clock generator circuit 104. The sample clock generator circuit generates a sample signal $F_S$. The sample signal $F_S$ can be a signal with a sampling frequency that is greater than or equal to a Nyquist frequency that is associated with the signal $V_{IN}$. As such, the sample signal $F_S$ can be operative to sample the signal $V_{IN}$ at periodic intervals. The analog-to-digital conversion system 100 can also include a duty cycle adjuster 106 that outputs a signal DC_ADJ to the sample clock generator circuit 104. The duty cycle adjuster 106 can provide adjustability of a duty cycle associated with the sample signal $F_S$, as will be described further in the below example of FIG. 6. The sample signal $F_S$ and the signal $V_{IN}$ are both input to a sample-and-hold circuit 108.

The sample-and-hold circuit 108 can operate to provide decimated samples of the signal $V_{IN}$, demonstrated in the example of FIG. 3 as decimated output samples $V_{OUT}$, at a rate that is approximately equal to the frequency of the sample signal $F_S$. For example, the sample-and-hold circuit 108 could include a sample stage that obtains a sample of the signal $V_{IN}$ and a hold stage that transfers the obtained sample to the output of the sample-and-hold circuit 108. It is to be understood that the decimated output samples $V_{OUT}$ could have a differential voltage potential, such that the signal $V_{IN}$ could be a differential signal, or alternatively the sample-and-hold circuit 108 could include single-ended to differential signal conversion.

In addition to providing the decimated samples of the signal $V_{IN}$, the sample-and-hold circuit 108 could also substantially eliminate aliasing in the signal $V_{IN}$. For example, the sample-and-hold circuit could substantially eliminate aliasing of the signal $V_{IN}$ by obtaining samples of the signal $V_{IN}$ at a rate that is approximately twice the frequency of the sample signal $F_S$. The decimated output samples $V_{OUT}$ of the signal $V_{IN}$ can each be associated with two consecutive samples of the signal $V_{IN}$ as obtained, such as from the sample stage during both a sample phase and a hold phase. For example, each of the decimated output samples $V_{OUT}$ could be an average of two consecutive samples of the signal $V_{IN}$ obtained during a sample phase and a hold phase. The resultant decimated output samples $V_{OUT}$ can thus be a more accurate representation of the signal $V_{IN}$, such that it is substantially free from the detrimental effects of aliasing of noise with a frequency around that of the sampling signal. In other words, as is demonstrated further in the below example of FIG. 6, the anti-aliasing component of the sample-and-hold circuit 108 effectively acts as a decimated finite impulse response (FIR) filter that attenuates noise in a frequency range that is substantially equal to the frequency of the sample signal $F_S$. As the anti-aliasing frequency range of interest is substantially equal to the frequency of the sample signal $F_S$, attenuation of other sources of noise can be accomplished by other filters, such as the filter 102, and/or by a digital filter following the analog-to-digital converter 110.

The decimated output samples $V_{OUT}$ are input to an ADC 110. The ADC 110 converts the decimated samples of the signal $V_{IN}$ into a digital representation, demonstrated as the output signal DIG_OUT. As an example, the ADC 110 could be a pipelined ADC. The ADC 110 can also receive the sample signal $F_S$ as an input, such that the ADC 110 can output the digital samples of the signal $V_{IN}$ at a rate that is approximately equal to the frequency of the sample signal $F_S$. Due to the anti-aliasing component of the sample-and-hold circuit 108, the digital samples of the signal $V_{IN}$ in the output signal DIG_OUT can be a more accurate representation of the original baseband signal $V_{IN}$, such that the detrimental effects resulting from aliasing of noise at frequencies that are that are odd multiples of the sample signal $F_S$ to the baseband signal are substantially eliminated.

It is to be understood that the analog-to-digital conversion system 100 is not intended to be limited by the example of FIG. 3. As such, certain components may not be included, or other components that are not demonstrated in the example of FIG. 3 may be included. As an example, the analog-to-digital conversion system 100 may not include the filter 102, such that the sample-and-hold circuit 108 obtains samples directly from the analog signal AN_IN. As another example, the analog-to-digital conversion system 100 may also include a variety of other devices, such as data buffers, a programmable gain amplifier, and/or a voltage level shifter that could be performed by the analog-to-digital converter 108.

Figure 4:
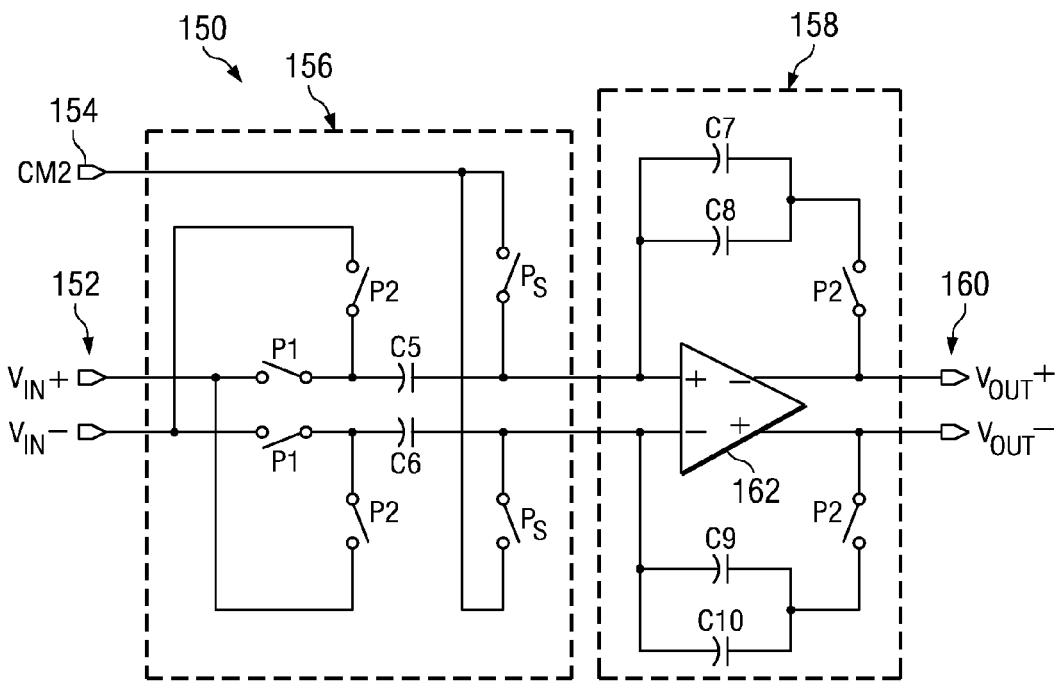
FIG. 4 illustrates an example of a sample-and-hold circuit in accordance with an aspect of the invention.

FIG. 4 illustrates an example of a sample-and-hold circuit 150 in accordance with an aspect of the invention. The sample-and-hold circuit 150 receives a differential signal $V_{IN}$ as an input. The differential signal $V_{IN}$ is demonstrated in the example of FIG. 4 as a positive rail input signal $V_{IN}+$ and a negative rail input signal $V_{IN}-$ at input terminals 152. A common mode signal CM2, at a terminal 154, is a common mode signal reference used by the sample-and-hold circuit 150 for sampling the differential signal $V_{IN}$. It is to be understood that the input signal $V_{IN}$ can be a differential signal, such that the negative rail input signal $V_{IN}-$ is a complement of the positive rail input signal $V_{IN}+$. Thus, the negative rail input signal $V_{IN}-$ may not be negative relative to zero, but could be negative relative to a common mode of the input signal. In addition, the common mode signal CM2 could have a floating voltage potential, as well. In addition, it is also to be understood that the signal $V_{IN}$, although demonstrated in the example of FIG. 4 as differential, could instead be a single-ended signal. For example, the signal $V_{IN}+$ could be a positive time-varying voltage signal, the signal $V_{IN}-$ could be ground, and the associated common mode could be a time-varying positive voltage signal having a voltage substantially between the voltage potential of the signal $V_{IN}+$ and ground.

The sample-and-hold circuit 150 includes a sample stage 156 and a hold stage 158. The sample stage 156 could operate to obtain the samples of the differential signal $V_{IN}$ at a given sampling rate. The hold stage 158 could operate to transfer the obtained samples to an output of the sample-and-hold circuit 150 as decimated output samples $V_{OUT}$ at output terminals 160. The sample stage 156 includes a pair of switches controlled by a clock signal P1 (hereinafter "P1 clock switch(es)"), a pair of switches P2 (hereinafter "P2 clock switch(es)"), a pair of switches $P_S$ (hereinafter "$P_S$ clock switch(es)"), a capacitor C5, and a capacitor C6. The hold stage 158 includes a pair of P2 clock switches, parallel connected capacitors C7 and C8, parallel connected capacitors C9 and C10, and an inverting amplifier 162. The inverting amplifier 162 has a positive input terminal that is coupled to the capacitors C5, C7, and C8, and a negative input terminal that is coupled to the capacitors C6, C9, and C10. The common mode signal CM2 can be a voltage potential that is sufficient to bias the inverting amplifier 162. The inverting amplifier 162 also has output terminals that are coupled to the output terminals 160 of the sample-and-hold circuit 150, which outputs the decimated output samples $V_{OUT}$.

Figure 2:
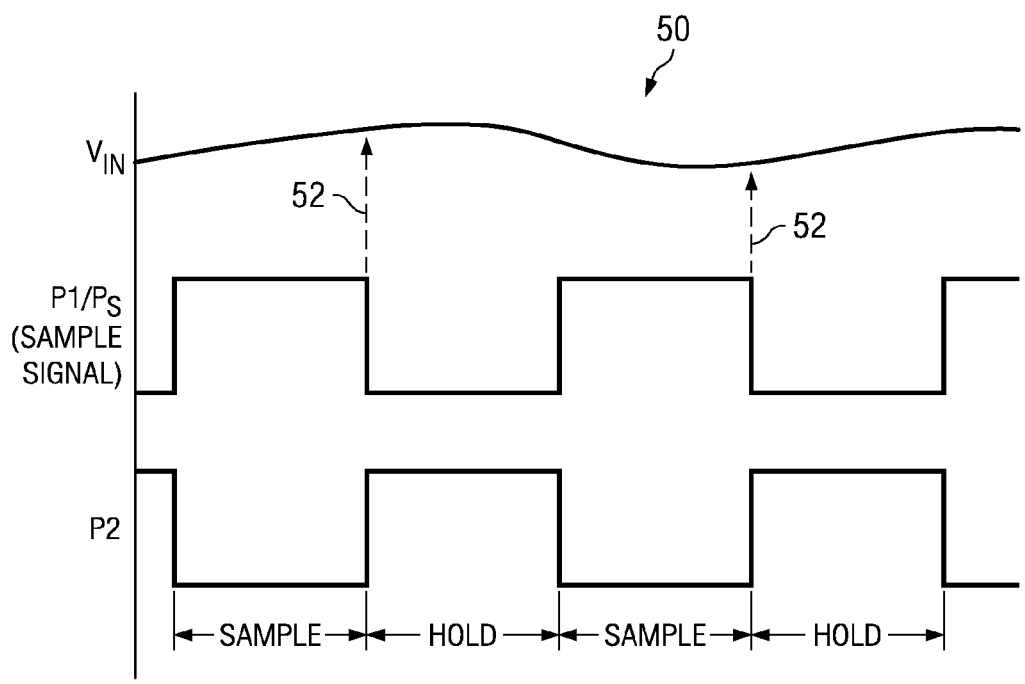
FIG. 2 illustrates an example of a timing diagram associated with the prior art example of the sample-and-hold circuit of FIG. 1.

The $P_S$ clock signal defines a sample signal (not shown) that defines a sampling rate associated with the sample-and-hold circuit 10, as will be better described below in the example of FIG. 5. The sample signal can have a period that defines both a sample phase and a hold phase. The operation of the sample signal in relation to the closure of the P1, P2 and $P_S$ clock switches is substantially the same as that demonstrated above in the example of FIG. 2. For example, the sample signal can define the sample phase when the sample signal is asserted (i.e., P1 and $P_S$ being logic high) and can define the hold phase when the sample signal is de-asserted (i.e., P2 being logic low). Accordingly, the P1 and $P_S$ clock switches can close during the sample phase, and the P2 clock switches can close during the hold phase.

Figure 1:
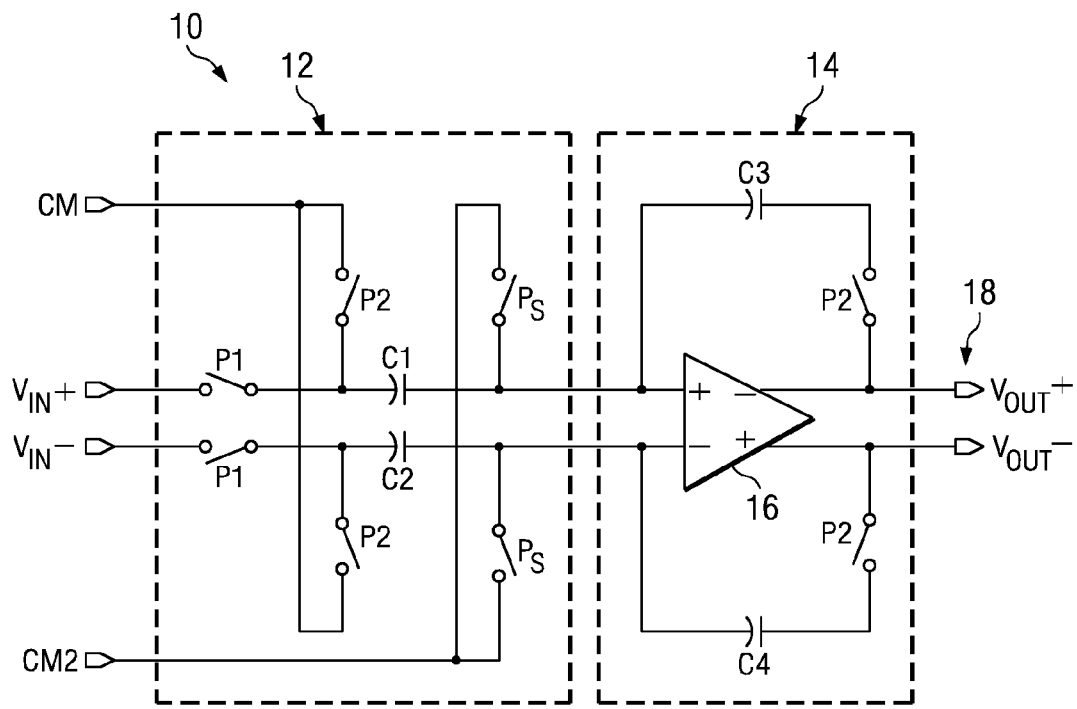
FIG. 1 illustrates a prior art example of a sample-and-hold circuit.

During the sample phase, due to the closure of the P1 and $P_S$ clock switches, the capacitor C5 becomes coupled to the signal $V_{IN}+$ and the common mode signal CM2, and the capacitor C6 becomes coupled to the signal $V_{IN}-$ and the common mode signal CM2. Therefore, the capacitors C5 and C6 each become charged with a voltage potential of $V_{IN}+$ and $V_{IN}-$, respectively, during the sample phase. Such an operation is similar to the sampling operation as described in the example of FIG. 1 above. During the hold phase, the P1 and $P_S$ clock switches open and the P2 clock switches close. The capacitor C5 becomes coupled to the capacitors C7 and C8 and the capacitor C6 becomes coupled to the capacitors C9 and C10. However, instead of the capacitors C5 and C6 also becoming coupled to the common mode voltage CM, as described above for the capacitors C1 and C2 in the example of FIG. 1, the capacitors C5 and C6 become coupled to the opposite rail of the differential signal $V_{IN}-$ and $V_{IN}+$, respectively.

For example, the capacitor C5, having been charged with the voltage potential $V_{IN}+$ during the sample phase, becomes coupled to the signal $V_{IN}-$ during the hold phase. Likewise, the capacitor C6, having been charged with the voltage potential $V_{IN}-$ during the sample phase, becomes coupled to the signal $V_{IN}+$ during the hold phase. The result is that the charge on each of the capacitors C5 and C6 swings to the opposite voltage potential of the differential signal $V_{IN}$ during the hold phase. In other words, the capacitors C5 and C6 discharge relative to the opposite voltage potential of the differential signal $V_{IN}$ instead of relative to the common mode signal CM2. As such, the sample stage 156 effectively keeps tracking the differential signal $V_{IN}$ during the hold phase, and provides an output sample at the end of the hold phase that is double in amplitude of an average of the two obtained samples. The amplitude of the output sample is also multiplied by a gain which is a ratio of the capacitance of the sampling capacitors C5 and C6 to the capacitance of the capacitors C7+C8 and the capacitors C9+C10, respectively. Additionally, by sampling and aggregating both the rails of the input signal in a sample and hold period, the noise at the sampling frequency is substantially mitigated since the aggregation of the opposite phases causes cancellation of the noise at the sampling frequency. The capacitance values of the pairs of capacitors C5 and C6, C7 and C10, and C8 and C9 could be set equal to each other. Additionally, by setting the capacitance values of the capacitors C7, C8, C9, and C10 all equal to each other, 6 dB of gain introduced by double sampling can be attenuated, as may be desirable for a given application.

Figure 5:
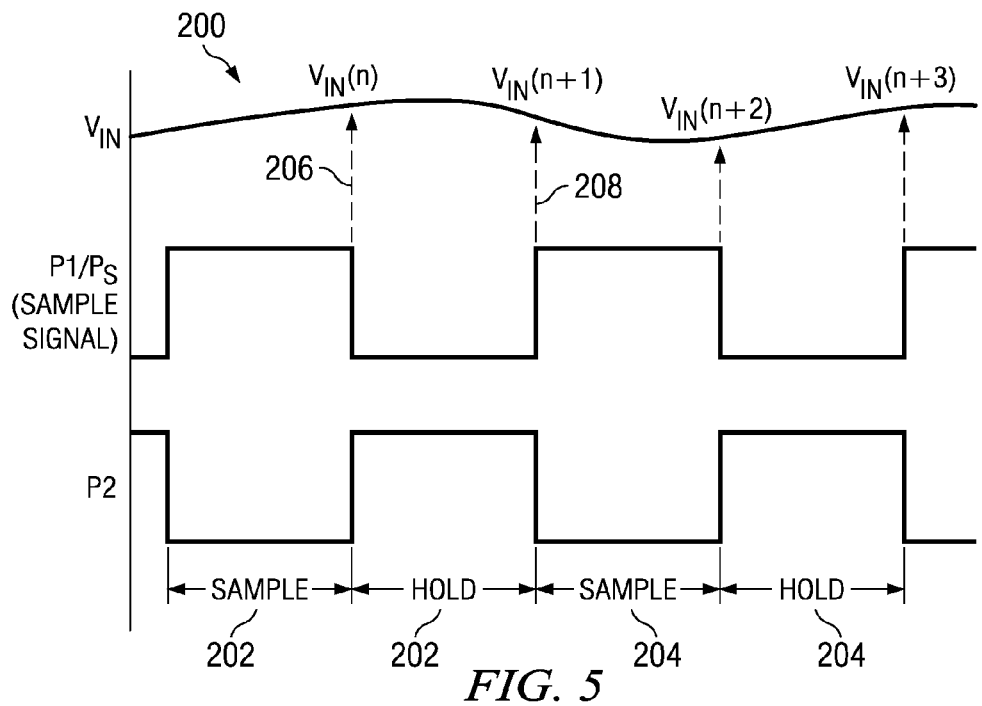
FIG. 5 illustrates an example of a timing diagram of the sample-and-hold circuit of FIG. 4 in accordance with an aspect of the invention.

FIG. 5 illustrates an example of a timing diagram 200 associated with the sample-and-hold circuit 150 in the example of FIG. 4. The example of FIG. 5 demonstrates an example of the operation of the sample signal in relation to the P1, P2 and $P_S$ clock switches. It is to be understood that, despite the example of FIG. 5 demonstrating an ideal timing diagram, the timing of the closure of the P1, P2 and $P_S$ clock switches can include delays and variations as described above in the example of FIG. 2. For example, the sample signal defined by $P_S$ can deactivate before the clock signal P1 to avoid signal dependent charge injection. It is also to be understood that, throughout the discussion herein of FIG. 5, reference will be made to FIG. 4, such that like identifiers and reference numbers will be used.

The timing diagram 200 demonstrates a sample phase and a hold phase defined by each of a period 202 and a period 204 of the sample signal. During the period 202, a sample $V_{IN}(n)$ of the differential signal $V_{IN}$ is captured at the end (i.e., falling edge) of the sample phase defined by the sample signal $P_S$, demonstrated at a dashed line 206. During the subsequent hold phase, while the sample-and-hold circuit 150 holds the sample $V_{IN}(n)$, a sample $V_{IN}(n+1)$ of the differential signal $V_{IN}$ is tracked during the hold phase. Similarly, during the period 204, this described sampling process is repeated by obtaining the sample $V_{IN}(n+2)$ and the sample $V_{IN}(n+3)$ of the differential signal $V_{IN}$, and so forth for consecutive samples.

During the hold phase, in addition to being coupled to the opposite input terminals 152 of the differential signal $V_{IN}$, the capacitor C5 also becomes coupled to the capacitors C7 and C8, and the capacitor C6 also becomes coupled to the capacitors C9 and C10. The capacitors C7, C8, C9, and C10 also become coupled to the output terminals 160. Therefore, for example, the capacitor C5, during the hold phase of the period 202, discharges the charge from the captured sample of the differential signal $V_{IN}$ at the dashed line 206 from the sample phase to the capacitors C7 and C8, and continues to track the differential signal $V_{IN}$ during the hold phase. Concurrently, the differential side of the sample-and-hold circuit 150 that includes the capacitors C6, C9, and C10 behaves similarly. At the end of the hold phase, demonstrated at a dashed line 208, the decimated output of the sample-and-hold circuit 150 is the average of the sample $V_{IN}(n)$ and the sample $V_{IN}(n+1)$ multiplied by a gain that is based on relative capacitance values of the capacitors C5 through C10. Similarly, during the period 204, this described hold process is repeated by discharging of the captured samples $V_{IN}(n+2)$ and $V_{IN}(n+3)$ of the differential signal $V_{IN}$. It is to be understood that, despite the sampling of the differential signal $V_{IN}$ being at twice the frequency of the sample signal, the decimation of output samples occurs at substantially the same frequency as the sample signal.

Due to the voltage swing achieved by each of the capacitors C5 and C6 during the hold phase from one polarity of the differential signal $V_{IN}$ to the opposite polarity, the capacitors C5 and C6 discharge a voltage that is an aggregate sum of absolute values of two consecutive samples of the differential signal $V_{IN}$ during the hold phase. In other words, because the capacitors C5 and C6 become coupled to the opposite polarity voltage of the differential signal $V_{IN}$, rather than the common mode as described in the prior art example of FIG. 1, the sample-and-hold circuit 150 samples the input signal at twice the frequency of the sample signal, and sums and decimates the output signal $V_{OUT}$ at the output 160.

The capacitors C7 and C8 and the capacitors C9 and C10 can have a capacitance that is substantially equal to each other and to the capacitors C5 and C6. As such, the absolute value aggregate sum voltage of the two consecutive samples that is discharged by the capacitor C5 can charge the capacitors C7 and C8 equally due to the capacitors C7 and C8 being configured in parallel. Therefore, because each of the capacitors C7 and C8 receive approximately half the current associated with the absolute value aggregate sum voltage of the two consecutive samples, the capacitors C7 and C8 could each be charged with a voltage that is approximately half the absolute value aggregate sum voltage of the two consecutive samples that is discharged by the capacitor C5. Since the voltage across each of the capacitors C7 and C8 is half the sum of the voltages of the two consecutive samples, the voltage across each of the capacitors C7 and C8 is an average of the voltage of the two consecutive samples.

The resultant decimated output samples $V_{OUT}$ of the sample-and-hold circuit 150 therefore reflect averaged samples of double the frequency of the sample signal, despite being output at a rate that is substantially equal to the frequency of the sample signal. As such, noise components having a frequency that is substantially equal to the frequency of the sample signal can be effectively attenuated due to phase noise cancellation. In addition, noise components can be further reduced due to the increased amplitude of the sample signal relative to the noise at the sample frequency for signals that require doubling the gain. The decimated output samples $V_{OUT}$ can thus be a more accurate representation of the differential signal $V_{IN}$, such that it is substantially free from the detrimental effects of noise around the frequency of the sample signal, as well as odd multiples of the frequency of the sample signal, aliased back to the baseband sampled input signal. In other words, the anti-aliasing effect of the sample-and-hold circuit 150 effectively acts as a decimated FIR filter that attenuates noise in a frequency range of interest that is substantially equal to the frequency and odd multiples of the frequency of the sample signal. In addition, because the anti-aliasing effect of the sample-and-hold circuit 150 behaves as a decimated FIR filter, associated phase delay is linear, and thus there is no need for phase delay compensation that may be required in active multi-stage filters. Also, the inclusion of the anti-aliasing feature in the sample-and-hold circuit 150 requires very few additional components, thus making it easy to implement in an integrated sample-and-hold and ADC package. Furthermore, for applications that may not require an anti-alias filter, the above described filtering operation can easily be bypassed to behave as prior art, as demonstrated by the example of FIG. 1, by enabling the P2 clock switches in the sample stage 156 to switch to an input common mode CM, such as described above in the example of FIG. 1, and disabling the capacitors C7 and C10.

Figure 6:
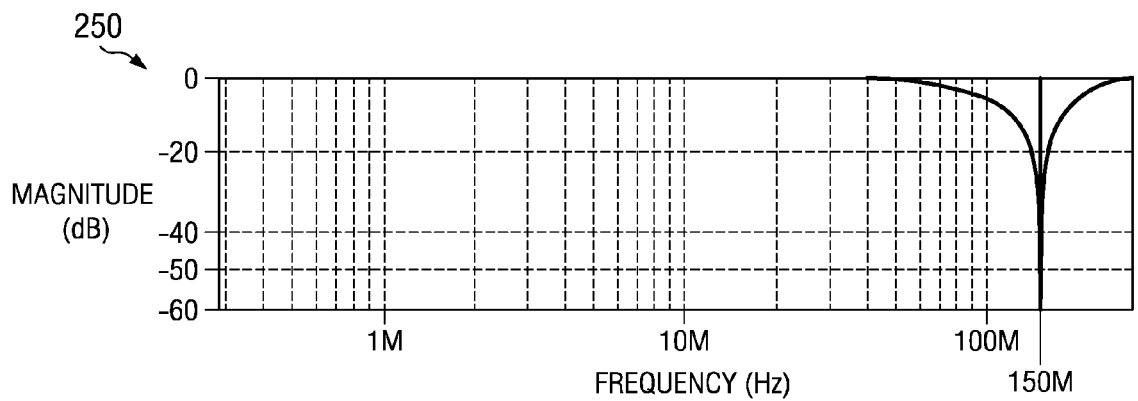
FIG. 6 illustrates an example of a frequency domain graph in accordance with an aspect of the invention.

An example of the noise attenuation of the frequency range of interest of the sample-and-hold circuit 150 is demonstrated in the example of FIG. 6. FIG. 6 illustrates an example of a frequency domain graph 250 of the sample-and-hold circuit 150 in the example of FIG. 4 in accordance with an aspect of the invention. In the example of FIG. 6, the anti-aliasing feature of the sample-and-hold circuit 150 creates an attenuation notch at a frequency that is substantially equal to the frequency of the sample signal, demonstrated in the example of FIG. 6 as approximately 150 MHz. Noise in other frequencies outside of the frequency band of interest can be filtered if necessary, for example, by other internal and/or external noise filters. In addition, it is to be understood that the sample-and-hold circuit 150 is not limited to filtering 150 MHz, as demonstrated in the example of FIG. 6, but can filter any of a variety of frequencies as may be dictated by the relevant sampling frequency.

In addition, as illustrated in the example of FIG. 5, a sample is obtained at the end of each defined sample phase and hold phase of a given period of the sample signal. Therefore, the anti-aliasing filter effect of the sample-and-hold circuit 150 can be tuned to provide noise attenuation at different frequencies by adjusting the duty cycle of the sample signal, without adjusting the frequency. For example, by adjusting the duty cycle of the sample signal while keeping the frequency of the sample signal the same, the sample phase and the hold phase are no longer uniform in duration. Therefore, samples of the differential signal $V_{IN}$ can be obtained at non-uniform intervals to provide attenuation of noise components at frequencies other than the frequency of the sample signal and associated odd multiples.

Referring back to FIG. 4, it is to be understood that the sample-and-hold circuit 150 is not intended to be limited to the example of FIG. 4. For example, the hold stage 158 of the sample-and-hold circuit 150 could have just two capacitors, one for each of the output terminals 160, instead of four. By eliminating one of the parallel connected capacitors C7 and C8, as well as one of the parallel connected capacitors C9 and C10, the charge that is transferred from the sample stage to the hold stage during the hold phase is no longer divided by two, and thus is not an average of the voltage of two consecutively obtained samples. Therefore, at the end of a given hold phase, the voltage of the decimated output sample $V_{OUT}$ is substantially equal to an absolute value aggregate sum of the voltage of two consecutively obtained samples. Accordingly, the sample-and-hold circuit 150 can provide a gain that is approximately equal to twice an average of the absolute value aggregate sum of two consecutive samples of the differential signal $V_{IN}$ without adding additional components. Such a configuration could provide a gain that may be necessary to achieve a sufficient input dynamic range for a downstream ADC. It is to be understood that gain of the decimated output samples $V_{OUT}$ can be modified in other ways, as well, such as by implementing capacitors of varying capacitance characteristics relative to each other.

The sample-and-hold circuit 150 could also include other modifications other than that which is demonstrated in the example of FIG. 4. For example, the sample-and-hold circuit 150 could have additional common mode voltages associated with the P1 and/or $P_S$ clock switches. As another example, another set of P1 clock switches could couple the capacitors C7 and C8, as well as the capacitors C9 and C10, to a differential reference signal, such that the decimated output samples $V_{OUT}$ could reflect a level-shifted voltage potential. Additionally, the inverting amplifier 162 need not be an inverting amplifier, but could be any of a variety of other amplifiers, such as an operational trans-conductance amplifier. In addition, the sample-and-hold circuit 150 can be easily modified such that it can be switched between the anti-aliasing feature, such as described in the example of FIGS. 4-6, and a typical sample-and-hold architecture, such as described above in the example of FIGS. 1 and 2, depending on the desired application.

Figure 7:
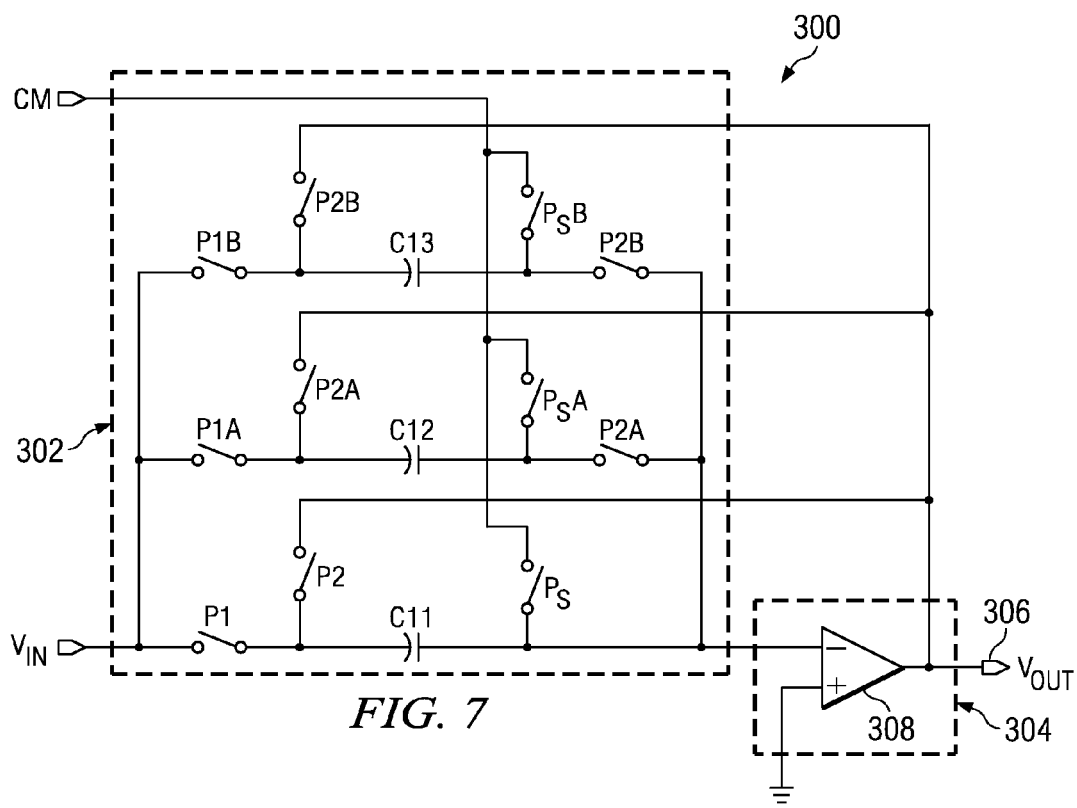
FIG. 7 illustrates another example of a sample-and-hold circuit in accordance with an aspect of the invention.

FIG. 7 illustrates another example of a sample-and-hold circuit 300 in accordance with an aspect of the invention. The sample-and-hold circuit 300 receives an input signal $V_{IN}$ as an input, as well as a common mode signal CM. The input signal $V_{IN}$ is demonstrated in the example of FIG. 7 as a single-ended signal, such that the common mode signal CM could be a negative voltage potential, such as ground. However, it is to be understood that the input signal $V_{IN}$, although demonstrated in the example of FIG. 7 as single-ended, could instead be a differential signal, such that the sample-and-hold circuit 300 receives both a $V_{IN}+$ and a $V_{IN}-$ signal, with the common mode signal CM being substantially centered between the two, such that the sample-and-hold circuit 300 can be differential, as well.

The sample-and-hold circuit 300 includes a sample stage 302 and a hold stage 304. The sample stage 302 could operate to obtain the samples of the input signal $V_{IN}$ at a given sampling rate. The hold stage 304 could operate to transfer the obtained samples to an output of the sample-and-hold circuit 304 as decimated output samples $V_{OUT}$ at an output terminal 306. The sample stage 302 includes P1, P1, P1B, P2, P2, P2B, $P_S$, $P_SA$, and $P_SB$ clock switches. The sample stage 302 also includes capacitors C11, C12, and C13. The hold stage 304 includes an amplifier 308. It is to be understood, however, that the clock switches P2, P2A, and P2B, as well as the capacitors C11, C12, and C13, are implemented in both the sample stage 302 and the hold stage 304. As such, the clock switches P2, P2A, and P2B, as well as the capacitors C11, C12, and C13, can be considered to be included in both the sample stage 302 and the hold stage 304. In the example of FIG. 7, the amplifier 308 includes a negative input terminal that is coupled to the sample stage 302 and a positive input terminal that is coupled to ground. However, it is to be understood that, in the above described example of the input signal VN being differential, the positive input terminal of the inverting amplifier could also be coupled to the sample stage 302, such that the sample stage 302 could, for example, include another set of switches and capacitors coupled to a negative rail $V_{IN}-$ input terminal. The amplifier 308 has an output terminal that is coupled to the output terminal 306 of the sample-and-hold circuit 300, which outputs the decimated output samples $V_{OUT}$ of the input signal $V_{IN}$.

Figure 8:
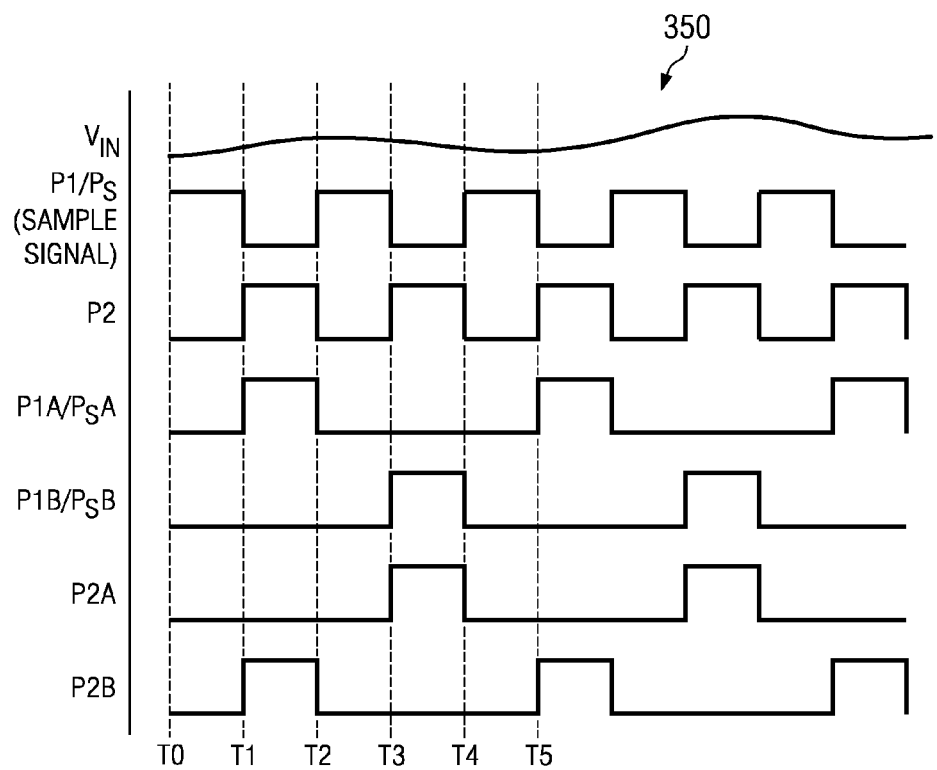
FIG. 8 illustrates an example of a timing diagram of the sample-and-hold circuit of FIG. 7 in accordance with an aspect of the invention.

The switches controlled by the clock signals P1, P1A, P1B, P2, P2A, P2B, $P_S$, $P_SA$, and $P_SB$ can be generated by a single sample signal (not shown) that defines a sampling rate associated with the sample-and-hold circuit 300. The sample signal can have a period that defines both a sample phase and a hold phase. The operation of the sample signal in relation to the closure of the P1, P1, P1B, P2, P2, P2B, $P_S$, $P_SA$, and $P_SB$ clock switches is demo in the example of FIG. 8. FIG. 8 illustrates an example of a timing diagram 350 of the sample-and-hold circuit 300 in the example of FIG. 7 in accordance with an aspect of the invention. For example, the sample signal can define the sample phase when the sample signal is asserted (i.e., logic high) and can define the hold phase when the sample signal is de-asserted (i.e., logic low). Accordingly, the P1 and $P_S$ clock switches can close during the sample phase, and the P2 clock switches can close during the hold phase, similar to the example of FIGS. 2 and 5 above. However, in the example of FIG. 8, the P1 $P_SA$, and P2B clock switches can close during every other hold phase, and the P1B, $P_SB$, and P2A clock switches can close during the alternate every other hold phase. It is to be understood that, despite the example of FIG. 8 demonstrating an ideal timing diagram, the timing of the closure of the P1, P1, P1B, P2, P2, P2B, $P_S$, $P_SA$ and $P_SB$ clock switches can include delays, similar to that described above with regard to FIGS. 2 and 5. It is also to be understood that, throughout the discussion herein of FIG. 8, reference will be made to FIG. 7, such that like identifiers and reference numbers will be used.

Referring to both FIGS. 7 and 8, at a time T0, a sample phase begins. The P1 and $P_S$ clock switches close, and the capacitor C11 becomes coupled to the input signal $V_{IN}$ and the common mode signal CM. Therefore, the capacitor C11 becomes charged with a voltage potential of $V_{IN}$ during the sample phase beginning at the time T0. Accordingly, the sample-and-hold circuit 300 obtains a sample of the input signal $V_{IN}$ at the end of the sample phase beginning at the time T0. At a time T1, a hold phase begins, such that the P1 and $P_S$ clock switches open and the P2, P1, $P_SA$, and P2B clock switches close. The capacitors C11 and C13 become coupled to the input and output terminals of the amplifier 308, such that they become configured in parallel with the amplifier 308 during the hold phase. Therefore, the capacitors C11 and C13 discharge to the hold stage 304, resulting in a decimated output sample $V_{OUT}$.

It is to be understood that, as will be described in greater detail below, the capacitor C13 could have been charged with the input signal $V_{IN}$ during a previous hold phase. Also during the hold phase beginning at the time T1, the capacitor C12 becomes coupled to the input signal $V_{IN}$ and to the common mode signal CM. Therefore, the capacitor C12 becomes charged with a voltage potential of $V_{IN}$ during the hold phase beginning at the time T1. Accordingly, the sample-and-hold circuit 300 obtains a sample of the input signal $V_{IN}$ at the end of the hold phase beginning at the time T1. Furthermore, because the sample-and-hold circuit 300 obtains a sample during both the sample phase and the hold phase, the sample-and-hold circuit 300 obtains samples of the input signal $V_{IN}$ at a sample rate that is twice the frequency of the sample signal.

At a time T2, another sample phase begins. The P1 and $P_S$ clock switches close, and the capacitor C11 becomes once again coupled to the input signal $V_{IN}$ and the common mode signal CM. Therefore, the capacitor C11 becomes charged with a voltage potential of $V_{IN}$ during the sample phase beginning at the time T2. Accordingly, the sample-and-hold circuit 300 obtains a sample of the input signal $V_{IN}$ at the end of the sample phase beginning at the time T2. At a time T3, another hold phase begins, such that the P1 and $P_S$ clock switches open and the P2 P1B, $P_SB$, and P2A clock switches close. The capacitors C11 and C12 become coupled to the input and output terminals of the amplifier 308, such that they become configured in parallel with the amplifier 308 during the hold phase beginning at the time T3. Therefore, the capacitors C11 and C12 each share their stored charges while coupled to the hold stage 304 in feedback, resulting in a decimated output sample $V_{OUT}$. Accordingly, because the capacitors C11 and C12 share their respective charges in parallel, the decimated output sample $V_{OUT}$ is an average of an aggregate sum of the voltages generated by the charge stored in each of the capacitors C11 and C12. Thus, during the hold phase beginning at the time T3, the sample-and-hold circuit 300 outputs a decimated output sample $V_{OUT}$ that is an average of the two consecutive samples of the input signal $V_{IN}$ obtained during the hold phase beginning at the time T1 and the sample phase beginning at the time T2.

Also during the hold phase beginning at the time T3, the capacitor C13 becomes coupled to the input signal $V_{IN}$ and to the common mode signal CM. Therefore, the capacitor C13 becomes charged with a voltage potential of $V_{IN}$ during the hold phase beginning at the time T3. Thus, the sample-and-hold circuit 300 obtains another sample of the input signal $V_{IN}$ at the end of the hold phase beginning at the time T3. As is demonstrated by the timing diagram 350, this sample of the input signal $V_{IN}$, as well as a sample of the input signal $V_{IN}$ obtained by the capacitor C11 during the sample phase beginning at a time T4, will be averaged as the decimated output sample $V_{OUT}$ during a hold phase beginning at a time T5 because the charges on the capacitors C11 and C13 will be shared during that time. Accordingly, the P1 and $P_S$ clock switches couple the capacitor C11 to the input signal $V_{IN}$ during every sample phase to obtain a sample, the P1A and $P_SA$ clock switches couple the capacitor C12 to the input signal $V_{IN}$ during every other hold phase to obtain a sample, and the P1B and $P_SB$ clock switches couple the capacitor C13 to the input signal $V_{IN}$ during the alternate every other hold phase to obtain a sample.

Likewise, the P2 clock switch couples the capacitor C11 in parallel with the amplifier 308 during every hold phase, the P2A clock switches couple the capacitor C12 in parallel with the amplifier 308 during every other hold phase, and the P2B clock switches couple the capacitor C13 in parallel with the amplifier 308 during the alternate every other hold phase. The result is that the sample-and-hold circuit 300 outputs a decimated output sample $V_{OUT}$ during every hold phase, the decimated output sample $V_{OUT}$ being an average of a sample of the input signal $V_{IN}$ being obtained during the previous hold phase and another sample of the input signal $V_{IN}$ being obtained during the previous sample phase.

The resultant decimated output samples $V_{OUT}$ of the sample-and-hold circuit 300 therefore reflect averaged samples of double the frequency of the sample signal, despite being output at a rate that is substantially equal to the frequency of the sample signal. As such, noise components having a frequency that is substantially equal to the frequency of the sample signal can be effectively attenuated. The decimated output samples $V_{OUT}$ can thus be a more accurate representation of the input signal $V_{IN}$, such that it is substantially free from the detrimental effects of aliasing. In other words, the anti-aliasing effect of the sample-and-hold circuit 300 effectively acts as a decimated FIR filter that attenuates noise in a frequency range of interest that is substantially equal to the frequency of the sample signal, as well as odd multiples of the frequency of the sample signal. In addition, because the anti-aliasing effect of the sample-and-hold circuit 300 behaves as a decimated FIR filter, associated phase delay is linear, and thus there is no need for phase delay compensation.

It is to be understood that the sample-and-hold circuit 300 is not intended to be limited to the example of FIG. 7. For example, additional capacitors controlled by additional clock switches can be included to allow for additional options, such as programmable gain or attenuation, level-shifting, and/or offset adjustment.

Figure 9:
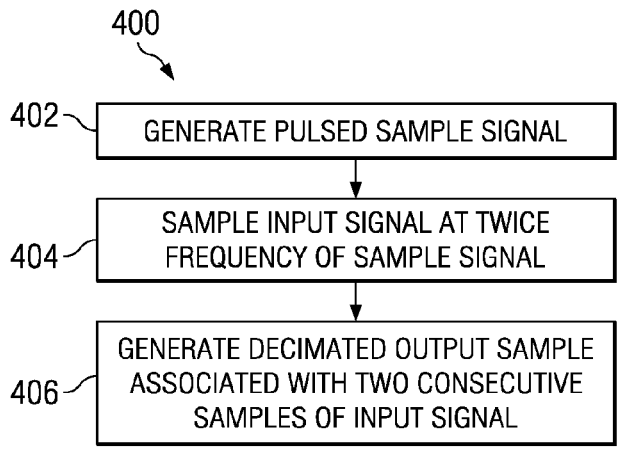
FIG. 9 illustrates a method of the operation of a sample-and-hold circuit in accordance with an aspect of the invention.

In view of the foregoing structural and functional features described above, certain methods will be better appreciated with reference to FIG. 9. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., analog or digital circuitry, such as may be embodied in an application specific integrated circuit or a computer system), software (e.g., as executable instructions stored on a computer readable media or running on one or more computer systems), or any combination of hardware and software.

FIG. 9 illustrates a method 400 of the operation of a sample-and-hold circuit in accordance with an aspect of the invention. At 402, a pulsed sample signal is generated. The pulsed sample signal could be a signal having a frequency that is at least twice a given input signal upon which the sample signal performs sampling. The pulsed sample signal could have a period that defines a sample phase and a hold phase associated with a sample-and-hold operation. At 404, the given input signal is sampled at a sampling rate that is twice the frequency of the sample signal during the sample phase. For example, a sample could be taken during both the sample phase and the hold phase. As an example, a capacitor can be alternately charged between a positive rail of the input signal during one of the sample phase and the hold phase, and a negative rail of the input signal during the other of the sample phase and the hold phase. The positive rail and the negative rail could be relative to an intermediate voltage, such as a common mode of a differential signal, or a voltage potential between a positive voltage and ground for a single-ended signal. As another example, a first capacitor can be charged with the input signal during the sample phase, and a second and third capacitor can each be charged during alternating hold phases.

At 406, a decimated output sample associated with two consecutive samples of the input signal is generated. The decimated output sample could be generated and output from the sample-and-hold circuit during the hold phase. As an example, the decimated output sample could be associated with a sample obtained during the sample phase and a sample obtained during the hold phase concurrently with the generation of the decimated output sample. As an alternative example, the decimated output sample could be associated with a sample obtained during the previous sample phase and a sample obtained during the previous hold phase. The decimated output sample could be an average of the two consecutive samples, or it could be an aggregate sum of the two consecutive samples.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A method for sampling of an input signal for providing to an analog-to-digital converter (ADC), the method comprising:
    generating a sample signal having a given frequency and a period that defines both a sample phase and a hold phase;
    sampling, with a capacitor, the input signal at both the sample phase and the hold phase; and
    generating a decimated output sample during the hold phase that is an aggregate of consecutive samples of the input signal obtained with the capacitor during the sample phase and the hold phase.

2. The method of claim 1, wherein the sampling the input signal at both the sample phase and the hold phase comprises at least one of sampling a positive rail of the input signal during the sample phase and a negative rail of the input signal during the hold phase and sampling a negative rail of the input signal during the sample phase and a positive rail of the input signal during the hold phase, wherein the charge associated with a sampling capacitor during the sample phase is substantially doubled during the hold phase.

3. The method of claim 2, wherein the input signal is a single ended signal, such that the positive rail of the input signal is a positive voltage and the negative rail of the input signal is ground.

4. A method for sampling of an input signal for providing to an analog-to-digital converter (ADC), the method comprising:
    generating a sample signal having a given frequency and a period that defines both a sample phase and a hold phase;
    sampling the input signal at both the sample phase and the hold phase;
    generating a decimated output sample that is an aggregate of consecutive samples of the input signal obtained during the sample phase and the hold phase; and
    varying a duty cycle associated with the sample signal to substantially reduce aliasing at a frequency that is different from the given frequency of the sample signal.

5. A method for sampling of an input signal for providing to an analog-to-digital converter (ADC), the method comprising:
    generating a sample signal having a given frequency and a period that defines both a sample phase and a hold phase;
    sampling the input signal at both the sample phase and the hold phase;
    generating a decimated output sample that is an aggregate of consecutive samples of the input signal obtained during the sample phase and the hold phase;
    wherein generating a decimated output signal comprises charging a pair of parallel connected capacitors with a voltage that is an aggregate sum of the sample associated with the sample phase and the consecutive sample associated with the hold phase, the plurality of parallel connected capacitors having a capacitance that is substantially equal such that the decimated output sample is an average of the sample associated with the sample phase and the consecutive sample associated with the hold phase.

6. The method of claim 5, wherein charging the pair of parallel connected capacitors comprises charging the pair of parallel connected capacitors during the hold phase.

7. A method for sampling of an input signal for providing to an analog-to-digital converter (ADC), the method comprising:
    generating a sample signal having a given frequency and a period that defines both a sample phase and a hold phase;
    sampling the input signal at both the sample phase and the hold phase; and
    generating a decimated output sample that is an aggregate of consecutive samples of the input signal obtained during the sample phase and the hold phase;
    wherein the sampling the input signal at both the sample phase and the hold phase comprises at least one of sampling a positive rail of the input signal during the sample phase and a negative rail of the input signal during the hold phase and sampling a negative rail of the input signal during the sample phase and a positive rail of the input signal during the hold phase, wherein the charge associated with a sampling capacitor during the sample phase is substantially doubled during the hold phase; and
    wherein the input signal is a differential signal, such that the positive rail of the input signal and the negative rail of the input signal are each referenced to a substantially centered common mode voltage.

8. A method for sampling of an input signal for providing to an analog-to-digital converter (ADC), the method comprising:
    generating a sample signal having a given frequency and a period that defines both a sample phase and a hold phase;
    sampling the input signal at both the sample phase and the hold phase; and
    generating a decimated output sample that is an aggregate of consecutive samples of the input signal obtained during the sample phase and the hold phase;
    wherein the sampling the input signal at both the sample phase and the hold phase comprises at least one of sampling a positive rail of the input signal during the sample phase and a negative rail of the input signal during the hold phase and sampling a negative rail of the input signal during the sample phase and a positive rail of the input signal during the hold phase, wherein the charge associated with a sampling capacitor during the sample phase is substantially doubled during the hold phase; and
    wherein the charge associated with the sampling capacitor during the hold phase is averaged to generate the decimated output sample that is an average of the positive rail of the input signal and an absolute value of the negative rail of the input signal during the hold phase.

9. A method for sampling of an input signal for providing to an analog-to-digital converter (ADC), the method comprising:
    generating a sample signal having a given frequency and a period that defines both a sample phase and a hold phase;
    sampling the input signal at both the sample phase and the hold phase; and generating a decimated output sample that is an aggregate of consecutive samples of the input signal obtained during the sample phase and the hold phase;
wherein sampling the input signal comprises sampling the input signal at a first capacitor at each sample phase and alternating between sampling the input signal at a second capacitor and sampling the input signal at a third capacitor during alternating hold phases.

10. The method of claim 9, wherein generating a decimated output sample comprises discharging the first capacitor concurrently with one of the second capacitor and the third capacitor to provide a decimated output sample that is an average of the input signal sampled at the first capacitor and the one of the second capacitor and the third capacitor during a given hold phase, and sampling the input signal at the other of the second capacitor and third capacitor during the given hold phase.

11. An anti-aliasing sample-and-hold circuit associated with an analog-to-digital converter (ADC), the sample-and-hold circuit comprising:
 a sample stage comprising a plurality of sample switches and a sample capacitor, the plurality of sample switches being controlled by a sample signal having a given frequency and a period that defines both a sample phase and a hold phase, the sample stage being operative to sample the input signal at both the sample phase and the hold phase and to generate samples of an input signal via the plurality of sample switches at a sampling rate that is approximately twice the given frequency of the sample signal; and
 a hold stage comprising an amplifier having an input that is coupled to the sample stage and an output that provides the output of the sample-and-hold circuit, the hold stage being operative to receive the voltage samples from the sample stage and to output decimated samples at the given frequency of the sample signal during a hold phase, each of the decimated samples being associated with two consecutive voltage samples from the sample stage taken at a given sample phase and a given hold phase by the sample capacitor.

12. The sample-and-hold circuit of claim 11, wherein the plurality of sample switches couple the at least one sample capacitor to a positive rail of the input signal during the sample phase and to a negative rail of the input signal during the hold phase, the positive rail and the negative rail being referenced to a substantially centered common mode voltage.

13. The sample-and-hold circuit of claim 12, wherein the at least one sample capacitor comprises a first capacitor, a second capacitor, and a third capacitor, and wherein the plurality of sample switches couple the first capacitor to the input signal during the sample phase and couple the second capacitor and the third capacitor to the input signal during alternating hold phases, such that the first capacitor and one of the second capacitor and third capacitor are configured in parallel and coupled to the input of the amplifier during a first hold phase and the first capacitor and the other of the second capacitor and third capacitor are configured in parallel and coupled to the input of the amplifier during a second hold phase.

14. An analog-to-digital converter system comprising the sample-and-hold circuit of claim 11.

15. An anti-aliasing sample-and-hold circuit associated with an analog-to-digital converter (ADC), the sample-and-hold circuit comprising:
 a sample stage comprising a plurality of sample switches and at least one sample capacitor, the plurality of sample switches being controlled by a sample signal having a given frequency and a period that defines both a sample phase and a hold phase, the sample stage being operative to sample the input signal at both the sample phase and the hold phase and to generate samples of an input signal via the plurality of sample switches at a sampling rate that is approximately twice the given frequency of the sample signal; and
 a hold stage comprising an amplifier having an input that is coupled to the sample stage and an output that provides the output of the sample-and-hold circuit, the hold stage being operative to receive the voltage samples from the sample stage and to output decimated samples at the given frequency of the sample signal, each of the decimated samples being associated with two consecutive voltage samples from the sample stage at a given sample phase and a given hold phase;
 wherein the hold stage further comprises a hold capacitor connected in parallel with the amplifier, such that the hold capacitor receives a decimated sample during a hold phase that has a voltage that is approximately equal to a sum of the absolute value of two consecutive voltage samples from the sample stage.

16. An anti-aliasing sample-and-hold circuit associated with an analog-to-digital converter (ADC), the sample-and-hold circuit comprising:
 a sample stage comprising a plurality of sample switches and at least one sample capacitor, the plurality of sample switches being controlled by a sample signal having a given frequency and a period that defines both a sample phase and a hold phase, the sample stage being operative to sample the input signal at both the sample phase and the hold phase and to generate samples of an input signal via the plurality of sample switches at a sampling rate that is approximately twice the given frequency of the sample signal; and
 a hold stage comprising an amplifier having an input that is coupled to the sample stage and an output that provides the output of the sample-and-hold circuit, the hold stage being operative to receive the voltage samples from the sample stage and to output decimated samples at the given frequency of the sample signal, each of the decimated samples being associated with two consecutive voltage samples from the sample stage at a given sample phase and a given hold phase;
 wherein the hold stage comprises two hold capacitors connected in parallel with each other and with the amplifier, such that the two hold capacitors provide a decimated output sample that has a voltage that is approximately equal to an average of the two consecutive voltage samples from the sample stage.

17. An anti-aliasing sample-and-hold circuit associated with an analog-to-digital converter (ADC), the sample-and-hold circuit comprising:
 a sample stage comprising a plurality of sample switches and at least one sample capacitor, the plurality of sample switches being controlled by a sample signal having a given frequency and a period that defines both a sample phase and a hold phase, the sample stage being operative to sample the input signal at both the sample phase and the hold phase and to generate samples of an input signal via the plurality of sample switches at a sampling rate that is approximately twice the given frequency of the sample signal; and
 a hold stage comprising an amplifier having an input that is coupled to the sample stage and an output that provides the output of the sample-and-hold circuit, the hold stage being operative to receive the voltage samples from the sample stage and to output decimated samples at the given frequency of the sample signal, each of the decimated samples being associated with two consecutive voltage samples from the sample stage at a given sample phase and a given hold phase;

wherein a duty cycle of the sample signal is selectively adjustable to substantially reduce aliasing from a selected frequency band that is different from the given frequency of the sample signal.

18. An analog-to-digital converter (ADC) system comprising:

means for providing a sample signal having a given frequency;

means, including a sample capacitor, for generating a plurality of samples of an input signal at a frequency that is approximately double the given frequency of the sample signal;

means for providing decimated output samples at the given frequency of the sample signal during a hold phase, the decimated output samples having a voltage that is an aggregation of two consecutive samples of the plurality of samples of the input signal provided by the sample capacitor during a sample phase and the hold phase; and means for converting the decimated output samples to digital output values.

19. The system of claim 18, wherein the means for providing decimated output samples comprises means for providing decimated output samples that are an approximate average of the two consecutive samples of the plurality of samples of the input signal.

20. The system of claim 18, wherein the two consecutive samples comprise a first sample obtained at a sample phase and a second sample obtained at a hold phase.

21. An analog-to-digital converter (ADC) system comprising:

means for providing a sample signal having a given frequency;

means for generating a plurality of samples of an input signal at a frequency that is approximately double the given frequency of the sample signal;

means for providing decimated output samples at the given frequency of the sample signal, the decimated output samples having a voltage that is an aggregation of two consecutive samples of the plurality of samples of the input signal; and means for converting the decimated output samples to digital output values;

wherein the means for providing decimated output samples comprises means for providing decimated output samples that are an absolute value aggregate sum of the two consecutive samples of the plurality of samples of the input signal.

22. An analog-to-digital converter (ADC) system comprising:

means for providing a sample signal having a given frequency;

means for generating a plurality of samples of an input signal at a frequency that is approximately double the given frequency of the sample signal;

means for providing decimated output samples at the given frequency of the sample signal, the decimated output samples having a voltage that is an aggregation of two consecutive samples of the plurality of samples of the input signal; and means for convening the decimated output samples to digital output values;

further comprising means for adjusting a duty cycle of the sample signal to filter noise in a frequency that is different from the given frequency of the sample signal to substantially reduce aliasing.

* * * * *